United States Patent [19]

Mecredy, III

[11] Patent Number: 5,781,409
[45] Date of Patent: Jul. 14, 1998

[54] HEAT DISSIPATING LID HINGE STRUCTURE WITH LATERALLY OFFSET HEAT PIPE END PORTIONS

[75] Inventor: Henry E. Mecredy, III, Houston, Tex.

[73] Assignee: Compaq Computer Corporation, Houston, Tex.

[21] Appl. No.: 769,795

[22] Filed: Dec. 19, 1996

[51] Int. Cl.$^6$ .............................. G06F 1/20; H05K 7/20; F28D 15/02
[52] U.S. Cl. .............. 361/687; 16/223; 16/342; 361/700; 165/104.33; 174/15.2
[58] Field of Search .................. 16/223, 342; 364/708.1; 174/15.2; 165/80.4, 104.29, 104.33; 361/687, 680, 681, 699, 700, 704, 707; 62/259.2

[56] References Cited

U.S. PATENT DOCUMENTS

| | | | |
|---|---|---|---|
| 5,313,362 | 5/1994 | Hatada et al. | 361/687 X |
| 5,383,340 | 1/1995 | Larson et al. | 361/700 X |
| 5,588,483 | 12/1996 | Ishida | 361/687 X |
| 5,621,613 | 4/1997 | Haley et al. | 361/687 |
| 5,646,822 | 7/1997 | Bhatia et al. | 361/687 |

FOREIGN PATENT DOCUMENTS 702287  3/1996  European Pat. Off. ......... G06F 1/20

*Primary Examiner*—Michael W. Phillips
*Attorney, Agent, or Firm*—Konneker & Smith, P.C.

[57] ABSTRACT

A notebook computer display housing is pivotally connected to its associated CPU housing by a heat dissipating hinge structure having telescoped, relatively rotatable first and second sections respectively anchored to the CPU and display housings. The heat absorbing evaporation end of a first thermosyphoning heat pipe is conductively connected to a heat generating electronic component within the CPU housing, with the heat rejecting condensing end of the heat pipe defining the first hinge structure section. During computer operation, heat from the electronic component is sequentially transferred through the heat pipe and the second hinge structure section, in which the first hinge section is journaled, to the display housing for dissipation therefrom to ambient. Heat transfer from the second hinge structure section to the display housing is representatively facilitated by a second thermosyphoning heat pipe having an evaporator end received in an opening in the second hinge structure section, and laterally offset from the condensing end of the first heat pipe, and a condensing end thermally communicated with the display housing.

21 Claims, 1 Drawing Sheet

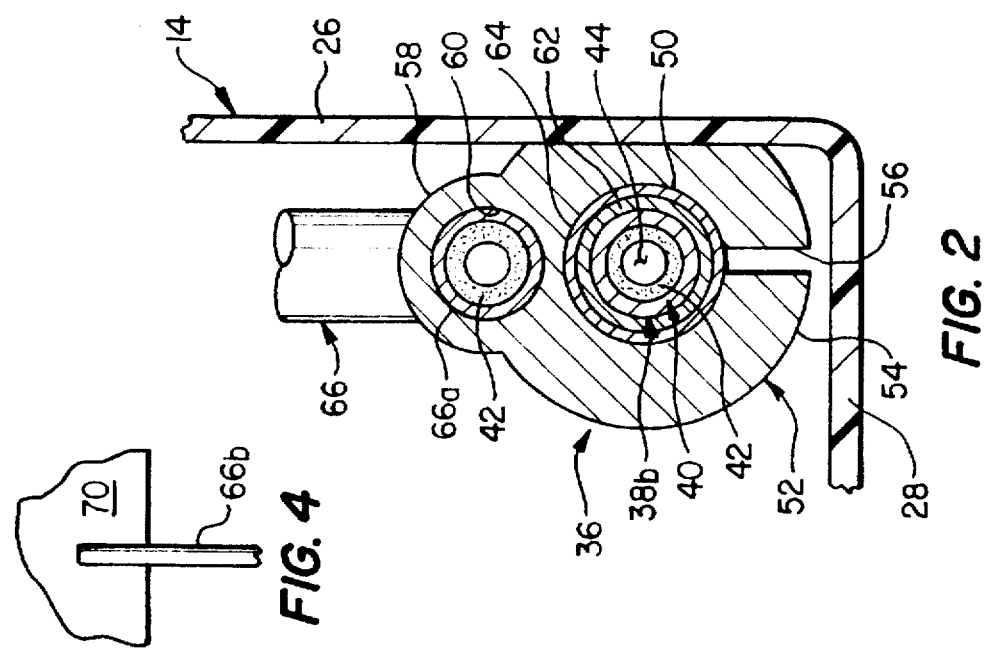
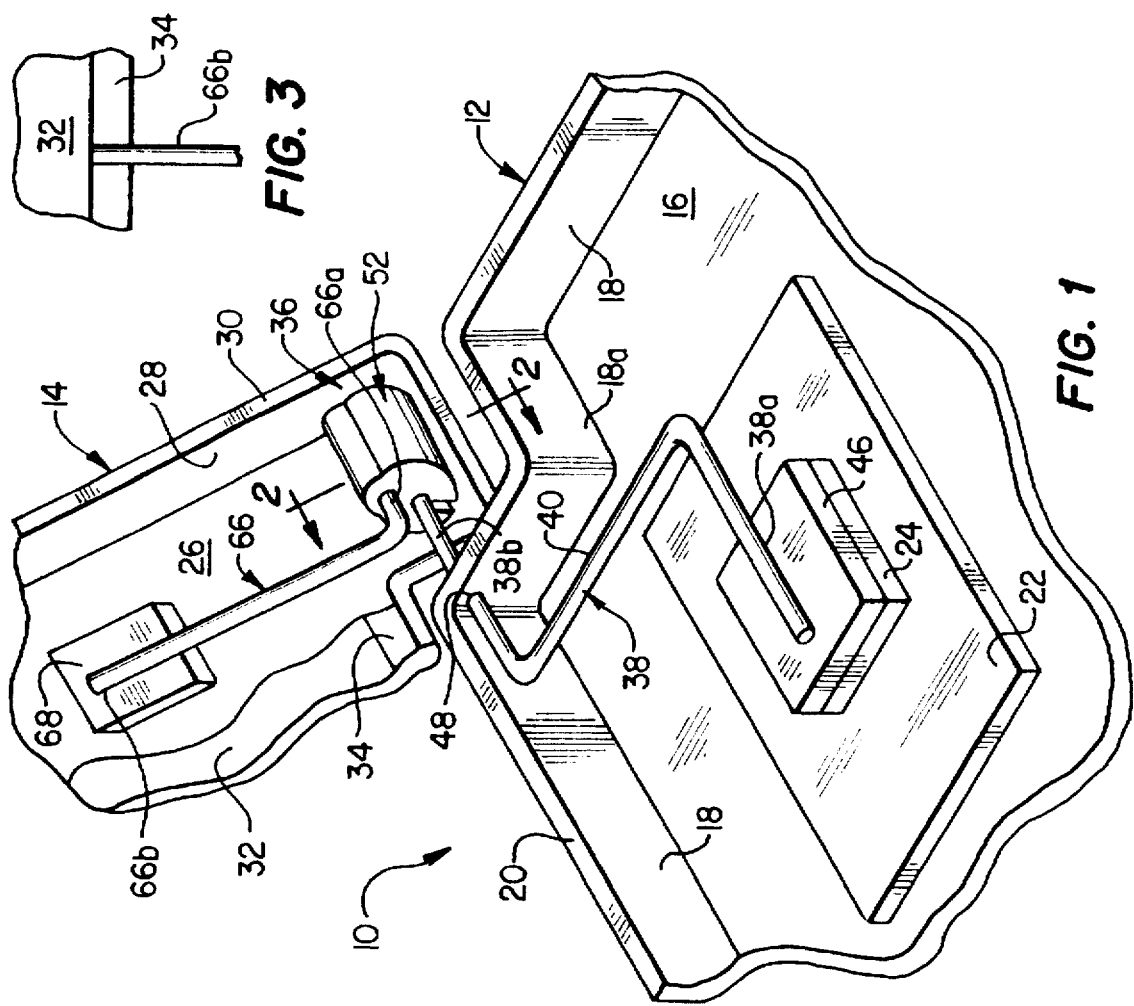

HEAT DISSIPATING LID HINGE STRUCTURE WITH LATERALLY OFFSET HEAT PIPE END PORTIONS

BACKGROUND OF THE INVENTION

1. Field of the Invention

The present invention generally relates to component operating heat dissipation in electronic apparatus and, in a preferred embodiment thereof, more particularly relates to the transfer of electrical component heat from the CPU housing portion of a notebook computer to its associated display housing portion for dissipation therefrom during use of the notebook computer.

2. Description of Related Art

Various electronic components used in computers generate heat during their normal operation. Among these components are typically microprocessors. If not removed from the heat-generating component, the heat raises the device temperature to a level that degrades the reliability and service life of the device, and may also adversely affect nearby components as well. This problem has become more acute in recent years due to the increasing power of microprocessors, and other electronic components, accompanied by correspondingly greater heat generation.

Contemporary notebook and subnotebook computer designs incorporate a central processing unit (CPU) housing and a display housing which is pivotally secured to the CPU housing and serves as a lid for selectively closing the computer for storage and transport thereof, and opening the computer to display its keyboard portion. The display or lid housing contains the visual display assembly and various other components. A relatively small proportion of the heat generated during computer operation is generated within the display housing.

Typically, an operating small computer dissipates a large fraction of its heat by elevating the temperature of the various surfaces of the CPU housing. Without forced air circulation within the CPU housing, only natural convention and radiation are available to remove heat from the CPU housing. Both of these phenomena must occur at the exterior surfaces of the CPU housing in order to remove heat from the housing (as opposed from simply redistributing heat within the housing).

The heat that can be transferred from a given surface, either by natural convection (as opposed to some manner of forced convection) or radiation, is limited by the surface area available and by the temperature difference between the surface and its surroundings (for example, air). For a notebook computer, the exterior surface of the housing and other case parts cannot be permitted to exceed temperatures that are comfortable to the user of the computer. At the same time, it is in the nature of such an intentionally compact computer class that the housing exterior surface must be small, so that the surface temperature must be correspondingly high to carry away the requisite amount of operating heat. These two conditions—the maintenance of relatively cool exterior surface temperature with only relatively small surface areas to dissipate relatively large operating heat quantities—are fundamentally contradictory.

It is therefore of great value to designers of small computers such as notebook computers to employ as much available surface area as possible for heat transfer to ambient via the heat transfer mechanisms of natural convection and radiation. The larger the external housing surface area that can be used for heat transfer, the lower the average surface temperature can be while still transferring heat at the same rate.

Currently, the back surface of the display housing of notebook computers is under-utilized in this respect in that during operation the temperature of this surface is elevated only slightly above ambient if at all. Meanwhile, the temperatures of the CPU housing surfaces approach levels that cause distinct operator discomfort when touched by the operator.

To the present applicant's knowledge, no production method is currently being utilized to efficiently transfer CPU housing heat to the display housing for dissipation to ambient air during computer operation. Heat is generally dissipated by a fan and/or by transfer through CPU housing exterior surfaces, as described above, without significant use of the display housing as a heat transfer entity and without explicit efforts to transfer heat between the CPU housing and the display housing.

Despite the known availability of the display housing as a potential sizeable augmentation to the operation heat convection and radiation dissipation area of the housing portion of the computer, an important hindrance to the efficient use of the display housing as a heat rejection surface for CPU housing-generated heat is the requirement that the display or housing rotate between open and closed positions relative to the CPU or base housing portion of the computer. While conducting heat between two fixed points is not generally difficult, transferring heat between two points whose relative locations are designed to change is complex under the constraints of the design of diminutive computers such as notebook and subnotebook computers.

It is accordingly an object of the present invention to provide apparatus and methods for efficiently transferring operating heat from a heat generating electrical component in a first computer housing portion to a second computer housing portion pivotally secured to the first housing portion to thereby facilitate heat dissipation to ambient from the second housing portion in a manner reducing the operating surface temperature of the first housing portion.

SUMMARY OF THE INVENTION

In carrying out principles of the present invention, in accordance with a preferred embodiment thereof, electronic apparatus, representatively a notebook computer, is provided that includes a housing having first and second portions, with a heat generating component such as a processor being carried in the first housing portion.

A hinge structure interconnects the first and second housing portions for pivotal movement relative to one another, the hinge structure having (1) a first section connected to the first housing portion, and (2) a second section which is connected to the second housing portion, is in a heat transfer relationship with the second housing portion, and is rotationally coupled to the first hinge section.

A heat transfer member is operative to transfer therethrough heat generated by the component in the first housing portion to the second housing portion via the hinge structure, the heat transfer member having a first portion in thermal communication with the component, and a second portion defining the first hinge section.

In a preferred embodiment of the invention, the heat transfer member is a first thermosyphoning heat pipe having an evaporation end portion in thermal communication with the heat generating component, and a condensing end portion journaled in the second hinge structure section. Thus, the first heat pipe serves the unique dual role of (1) transferring component operating heat from the first housing portion to the second housing portion for dissipation therefrom to ambient, and (2) defining a portion of the hinge structure that pivotally interconnects the first and second housing portions to one another.

To provide an increased amount of friction between the heat pipe condensing end portion and the second hinge section in which it is journaled, thereby permitting the overall hinge structure to function as a rotational friction clutch mechanism, a higher coefficient of friction material is suitably placed on the opposing pivot surfaces of the heat pipe condensing end portion and the second hinge section in which the heat pipe condensing end portion is journaled.

According to another feature of the invention, the component operating heat transfer to the second housing portion is augmented using a second thermosyphoning heat pipe disposed in the second housing portion and having an evaporation end in thermal communication with the second hinge section, and a condensing end portion in thermal communication with the second housing portion at a location thereon spaced apart from the hinge structure.

BRIEF DESCRIPTION OF THE DRAWINGS

FIG. 1 is a simplified perspective view of portions of CPU and display housing portions of a representative notebook computer in which heat pipes are incorporated in a specially designed heat dissipating hinge structure pivotally interconnecting the CPU and display housing portions and used to efficiently transfer electronic component operating heat from the CPU housing to the display housing for dissipation to ambient during use of the computer;

FIG. 2 is an enlarged scale cross-sectional view through the heat dissipating hinge structure taken generally along line 2—2 of FIG. 1; and FIGS. 3 and 4 schematically illustrate alternate methods of heat conductively associating the condensing end of an auxiliary hinge structure heat pipe to the computer display housing.

DETAILED DESCRIPTION

Perspectively illustrated in FIG. 1 is a portion of an electronic device, representatively a notebook computer 10, embodying principles of the present invention. Computer 10 includes a base or CPU housing portion 12, and a lid or display housing portion 14. CPU housing 12 has a generally rectangular shape with a bottom side wall 16, an upstanding peripheral wall 18 with an indented corner portion 18a, and an open top side 20 across which a keyboard structure (not shown) horizontally extends. Representatively, among other computer circuitry disposed within the CPU housing is a printed circuit board 22 mounted on the bottom side wall 16. A heat generating component, representatively a processor chip 24, is operatively mounted on the top side of the printed circuit board 22.

The display housing 14 has a rectangular configuration generally complementary to that of the CPU housing 12, and has a top side wall 26, a depending peripheral wall portion 28, and an open bottom side 30 across which a display screen 32 extends, the display screen 32 having a metal peripheral frame 34. Compared to the CPU housing 12 which typically has a variety of heat generating components (not shown) in addition to the representatively illustrated processor chip 24, the display housing 14 has only a relatively minimal amount of heat generating apparatus therein.

Thus, during operation of a conventionally constructed notebook computer its CPU housing tends to become considerably warmer to the touch than its display housing— each of which dissipates heat generated therein primarily by the heat transfer mechanisms of radiation and natural convection to ambient. As notebook computers become faster and more powerful, and the operating heat loads within their CPU housings correspondingly increase, the exterior temperatures of their CPU housings continuously increase toward a user-unacceptable level, and the need for heat dissipation beyond the previously relied on heat radiation and natural convection to ambient from the CPU housing becomes more critical.

Accelerating this need for additional heat dissipation from a notebook computer CPU housing is the trend toward making the computer smaller and smaller. This, of course, reduces the exterior surface of the CPU housing available to dissipate internal operating heat to ambient via radiation and natural convection. The shrinking of the exterior space envelope of modern notebook and subnotebook computers continues to make conventional auxiliary methods of carrying away interior operating heat from the CPU housing, such as internal cooling fans, more difficult and ineffective.

The present invention, however, uniquely transfers operating heat from the processor 24 (or other heat generating component as the case may be) to the display housing 14, to take advantage of its large exterior surface area in supplementing the radiant and convective heat dissipation to ambient of the CPU housing 12, using a specially designed heat dissipating friction hinge structure 36 shown in FIGS. 1 and 2. In conjunction with other suitable hinge apparatus of a conventional configuration (not shown) the hinge structure 36 serves to pivotally interconnect the display housing 14 to a rear side edge portion of the CPU housing 12 for pivotal movement between a generally upright operating orientation shown in FIG. 1, and a generally horizontal closed position (not shown).

According to a key aspect of the present invention, however, the hinge structure 36 also serves to transfer a considerable amount of the operational heat from the processor 24 to the display housing 14 via the hinge 36 using a generally conventional thermosyphoning heat pipe 38 which is in heat transfer communication with the processor 24 and also uniquely defines a portion of the heat dissipating hinge structure 36.

The heat pipe 38 has an exterior copper wall portion 40, is sealed at both ends, and has an evaporation end portion 38a for receiving heat, and a condensing end portion 38b for discharging the received heat. The interior of the heat pipe 38 is under a partial vacuum and contains a quantity of a vaporizable and condensable heat transfer liquid such as water. Along its length the interior side surface of the heat pipe 38 is lined with a suitable wicking material 42.

In a conventional manner, heat transmitted to the heat pipe evaporation end 38a evaporates liquid disposed in the wicking material therein and causes the evaporated liquid to travel to the condensing end 38b through the interior 44 of the heat pipe 38 for removal of heat from the evaporated liquid via the condensing end 38b of the heat pipe 38. The resultant cooling of the evaporated liquid in the heat pipe end portion 38b condenses the liquid which is then absorbed by the wicking material 40 in heat pipe end 38b and wicked back to the heat pipe end 38a for re-evaporation to repeat the thermosyphoning heat transfer cycle just described.

A copper thermal block 46 (see FIG. 1) is positioned atop the processor 24 to conductively receive operating heat therefrom, and the evaporation end 38a of the heat pipe 38 is positioned against the top side of the thermal block 46 to in turn conductively receive heat therefrom for transfer to the condensing end 38b of the heat pipe 38. The condensing end portion 38b of the heat pipe 38 is representatively extended outwardly through a circular opening 48 in the CPU housing peripheral wall 18 and journaled in a cylindrical passage 50 formed in a hinge section 52 suitably anchored to an inner side surface portion of the display housing in a heat conductive relationship therewith.

Representatively, the hinge section 52 is formed from copper, and the display housing 14 (like the CPU housing 12) is formed from plastic. However, the display housing 14 could be formed from metal, with the hinge section 36 being an integral portion of the display housing, if desired.

As viewed in FIG. 2, in cross-section the hinge section 52 has a partially circular base portion 54 through which the cylindrical passage 50 is formed, a radial slit 56 extending upwardly through the bottom side of base portion 54 into the cylindrical passage 50, and a partially circular top side projection 58 through which a cylindrical passage 60 extends parallel to the passage 50.

The overall hinge structure 36, an integral section of which is uniquely formed by the condensing end 38b of the heat pipe 38, is what may be referred to as a controlled friction hinge or a rotational "clutch" which permits relative rotation between the display housing 14 and the CPU housing 12 while permitting the user to adjust and maintain the angular use orientation of the display screen 32 relative to the CPU housing 12. A "threshold" torque is frictionally maintained between the heat pipe end portion 38b and the hinge section. This threshold torque must be overcome by the user to change the previously selected angular orientation between the CPU and display housing portions 12,14 of the computer 10. Stated otherwise, the threshold torque serves to releasably prevent the display housing 14 from simply falling forwardly or rearwardly from its selected angular use orientation.

Since copper is representatively used to form the hinge section 52 and the outer wall portion of the thermosyphoning heat pipe 38, because of the high thermal conductivity of copper, the pivotal clutch friction and wear characteristics at the interface between the heat pipe end portion 38b and the hinge section are preferably improved by respectively placing thin layers 62,64 of a frictional material on the outer side surface of the heat pipe end portion 38b and the hinge section passage 50 within which the heat pipe end portion 38b is journaled. This frictional material is preferably a harder metallic material and may representatively be electroplated chrome deposited on the outer side surface of the condensing heat pipe end 38b and the interior side surface of the hinge section passage 50, or thin steel bands press-fitted into the passage 50 and onto the heat pipe end portion 38b. The radial slit 56 in the hinge section 52 permits the insertion of the heat pipe end portion 38b into the passage 50 to slightly "spring" the hinge section base portion 54 outwardly in a lateral direction to maintain a suitable frictional clutch force between the contacting frictional material layers 62,64.

During operation of the computer 10, operating heat from the processor 24 is conducted to the evaporation end 38a of the heat pipe 38 through the thermal block 46. Operating heat received by the heat pipe evaporation end 38a is transferred along the length of the heat pipe 38 to its condensing/hinge member end 38b, and then transferred through the hinge section 52 to the display housing 14 for dissipation to surrounding ambient air by radiation and natural convection. Accordingly, processor (or other heat generating component) heat which in conventionally constructed portable computers was for the most part absorbed in the CPU housing, is now advantageously "split" between the CPU and display housings 12,14 with the result that the CPU housing 12 is now considerably cooler to the touch and the heat sensitive components in the CPU housing 12 are desirably subjected to lower operating temperatures.

During the usual operating orientation of the notebook computer 10, its CPU housing bottom side wall 16 is rested on a horizontal support surface such as a desktop or an airline seatback tray, thereby substantially interfering with both radiant and natural convention heat dissipation from this major exterior surface portion of the CPU housing 12. However, in contrast, the raised display housing 14 is entirely exposed to ambient air for purposes of radiant and convective heat dissipation thereto. Thus, the use in the present invention of the display housing's large heat dissipation surface area adds a major supplemental heat dissipation path to the computer.

In the representatively illustrated portable notebook computer 10, CPU housing component operating heat transfer from the hinge section 52 to the display housing 14 is preferably augmented using an auxiliary second heat pipe 66 disposed in the display housing 14. Heat pipe 66 is of the same construction as the previously described heat pipe 38, and has an evaporation end portion 66a, and a condensing end portion 66b. Evaporation end portion 66a is received in hinge section passage 60, which is in close proximity to the hinge section passage 50 that receives the condensing end portion 38b of the heat pipe 38, and the condensing end portion 66b of the heat pipe 66 is spaced apart from the evaporation end portion 66a and in thermal communication with the display housing 14.

In this manner, heat received by the hinge section 52 from the condensing end portion 38b of the heat pipe 38 is transferred to the evaporation end portion 66b of the heat pipe 66 and then transferred through the heat pipe 66 to a location of the display housing 14 remote from the hinge section 52, thereby more efficiently "spreading" CPU housing component heat along the display housing 14.

Representatively, as shown in FIG. 1, the condensing end portion 66b of the auxiliary heat pipe 66 is positioned against a copper thermal block 68 in turn positioned against the interior side surface of the display housing top side wall 26. Alternatively, and by way of example, the heat pipe condensing end portion 66b may be positioned against the metal frame portion 34 of the display screen 32 (as shown in FIG. 3), or against a metal EMI shield portion 70 of the display housing 14 (as shown in FIG. 70).

The foregoing detailed description is to be clearly understood as being given by way of illustration and example only, the spirit and scope of the present invention being limited solely by the appended claims.

What is claimed is:

1. Electronic apparatus comprising:
   a housing having first and second portions;
   a heat generating component carried in said first housing portion;
   a first heat pipe carried within said first housing portion and having a first end thermally coupled to said heat generating component, and a second end;
   a second heat pipe carried within said second housing portion and having a first end thermally coupled to said second housing portion, and a second end; and a hinge structure interconnecting said first and second housing portions for pivotal movement relative to one another, said hinge structure including:

a heat conductive first hinge section anchored to one of said first and second housing portions and connected to the second end of one of said first and second heat pipes in a heat exchange relationship therewith, and a heat conductive second hinge section defined by the second end of the other of said first and second heat pipes and journaled within said first hinge section, in a heat exchange relationship therewith, and thereby forming an integral portion of said hinge structure.

2. The electronic apparatus of claim 1 wherein:

said electronic apparatus is a portable computer.

3. The electronic apparatus of claim 2 wherein:

said portable computer is a notebook computer.

4. The electronic apparatus of claim 1 wherein:

said first hinge section is anchored to said second housing portion, said first end of said first heat pipe is an evaporation end thereof, and said second end of said first heat pipe is journaled in said first hinge section.

5. The electronic apparatus of claim 4 wherein:

the second end of said second heat pipe is received within said first hinge section.

6. A heat dissipating hinge structure comprising:

a first heat pipe having an end portion extending along an axis and defining a first hinge structure section;

a second hinge structure section formed of a heat conductive material, said second hinge structure section rotatably receiving said first hinge structure section and being in a heat conductive relationship therewith; and a second heat pipe having an end portion secured to said second hinge structure section at a location laterally offset from said axis, in a heat conductive relationship therewith, for rotation with said second hinge structure section relative to said first hinge structure section about said axis.

7. The heat dissipating hinge structure of claim 6 wherein:

said end portion of said first heat pipe is a condensing end portion thereof.

8. The heat dissipating hinge structure of claim 6 wherein:

said second hinge section has a generally cylindrical passage therein which receives said end portion of said first heat pipe and has an interior side surface with a coefficient of friction and lined with a frictional material having a coefficient of friction greater than that of said interior side surface, and said end portion of said first heat pipe has an exterior side surface having a coefficient of friction and being covered with a frictional material having a coefficient of friction greater than that of said exterior side surface and being frictionally but releasably engaged by said frictional material on said interior side surface of said second hinge section.

9. The heat dissipating hinge structure of claim 8 wherein:

said second hinge section and the outer wall portion of said first heat pipe are formed from copper, and each of said frictional materials is formed from a harder metal material.

10. A portable computer comprising:

a CPU housing;

a heat generating component in said CPU housing;

a display housing;

a hinge section secured to said display housing in a heat transfer relationship therewith;

a first heat pipe operative to transfer heat from said component to said hinge section and thus to said display housing for dissipation therefrom, said first heat pipe having an evaporating end portion thermally communicated with said component to receive operating heat therefrom, and a condensing end portion journaled in said hinge section to permit said display housing to pivot about said condensing end portion relative to said CPU housing; and a second heat pipe having an evaporating end portion in heat transfer communication with said hinge section, and a condensing end portion in heat transfer communication with said display housing, said hinge section having a first generally cylindrical passage therein which receives said condensing end portion of said first heat pipe, and a second generally cylindrical passage therein which receives said evaporating end of said second heat pipe.

11. The portable computer of claim 10 wherein:

said portable computer is a notebook computer.

12. The portable computer of claim 10 wherein:

said heat generating component is a processor.

13. The portable computer of claim 10 wherein:

said condensing end portion of said first heat pipe and said hinge section form a friction hinge structure.

14. The portable computer of claim 13 wherein:

said display housing has an outer wall portion, with an inner side surface, said portable computer further comprises a metallic heat transfer member positioned against said inner side surface in a spaced relationship with said hinge section, and said condensing end portion of said second heat pipe is in contact with said heat transfer member.

15. The portable computer of claim 13 wherein:

said display housing has a display screen with a metallic frame, and said condensing end portion of said second heat pipe is in contact with said metallic frame.

16. The portable computer of claim 13 wherein:

said display housing has a metallic EMI shield member therein, and said condensing end portion of said second heat pipe is in contact with said EMI shield member.

17. The portable computer of claim 10 wherein:

said portable computer further comprises a metallic heat transfer member sandwiched between and in heat conductive contact with said heat generating component and said evaporating end portion of said first heat pipe.

18. The portable computer of claim 17 wherein:

said heat generating component is a processor.

19. The portable computer of claim 10 wherein:

said first and second passages are parallel to one another.

20. The portable computer of claim 10 wherein:

said hinge section has a generally cylindrical passage therein which receives said condensing end portion of said first heat pipe and has an interior side surface with a coefficient of friction and lined with a frictional material having a coefficient of friction greater than that of said interior side surface, and said condensing end portion of said first pipe has an exterior side surface having a coefficient of friction and being covered with a frictional material having a coefficient of friction greater than that of said exterior side surface and being frictionally but releasably engaged by said frictional material on said interior side surface of said hinge section.

21. The portable computer of claim 20 wherein:

said hinge section and the outer wall portion of said first heat pipe are formed from copper, and each of said frictional materials is formed from a harder metallic material.

* * * * *

UNITED STATES PATENT AND TRADEMARK OFFICE
CERTIFICATE OF CORRECTION

PATENT NO. : 5,781,409
DATED : July 14, 1998
INVENTOR(S) : Henry E. Mecredy, III It is certified that error appears in the above-indentified patent and that said Letters Patent is hereby corrected as shown below:

In Claim 1, Column 7, Line 12, after "structure", insert --, the second ends of said first and second heat pipes being in a laterally offset relationship--.

Signed and Sealed this

Eighth Day of December, 1998

Attest:

Attesting Officer

BRUCE LEHMAN

Commissioner of Patents and Trademarks